United States Patent [19]
Jones

[11] Patent Number: 5,272,307
[45] Date of Patent: Dec. 21, 1993

[54] METHOD AND APPARATUS FOR LASER SOLDERING OF MICROELECTRONIC LEAD-PAD ASSEMBLIES ON CERAMIC SUBSTRATES

[75] Inventor: Marshall G. Jones, Scotia, N.Y.

[73] Assignee: General Electric Company, Schenectady, N.Y.

[21] Appl. No.: 960,348

[22] Filed: Oct. 13, 1992

[51] Int. Cl.$^5$ .............................. B23K 26/00
[52] U.S. Cl. ................ 219/121.6; 219/121.85; 219/85.13
[58] Field of Search ............... 219/121.63, 121.64, 219/85.12, 85.13, 85.21

[56] References Cited

U.S. PATENT DOCUMENTS 4,547,652 10/1985 Raisig et al. .................. 219/121.64
5,175,410 12/1992 Freedman et al. ............ 219/121.63

Primary Examiner—C. L. Albritton
Attorney, Agent, or Firm—Geoffrey H. Krauss; James R. McDaniel

[57] ABSTRACT

This invention relates to an method and apparatus for soldering microelectronic lead connections to pads on a ceramic substrate with the aid of a fiber based Neodymium:yttrium-aluminum-garnet (Nd:YAG) laser. Such structures of this type, generally, provide a means of delivering sufficient localized heating to the ceramic substrate to reflow solder plate or melt solder cream (paste) within the lead connection without any substrate preheating.

13 Claims, 2 Drawing Sheets

METHOD AND APPARATUS FOR LASER SOLDERING OF MICROELECTRONIC LEAD-PAD ASSEMBLIES ON CERAMIC SUBSTRATES

BACKGROUND OF THE INVENTION

1. Field of the Invention

This invention relates to an method and apparatus for soldering microelectronic lead connections to pads on a ceramic substrate with the aid of a fiber based neodymium:yttrium-aluminum-garnet (Nd:YAG) laser. Such structures of this type, generally, provide a means of delivering sufficient localized heating to the ceramic substrate to reflow solder plate or melt solder cream (paste) within the lead connection without any substrate preheating.

2. Description of the Related Art

It is known, in the microelectronic field, that there are many components that are becoming more and more sensitive to the packaging process. In particular, there are microelectronic chips that are sensitive to excess heating. When ceramic substrates are used for electronic packaging, excess heating can occur during a solder reflow lead connection process leading to potential component damage. This results from the relative high thermal conductivity of aluminum oxide and aluminum nitride as compared to an epoxy-glass substrate. The thermal conductivity comparison ratio would be approximately 364:57:1 for the material ratio of AlN:Al$_2$O$_3$:epoxy-glass. The thermal conductivity of epoxy-glass is approximately 0.294 Watts/m-C.

Typically, a ceramic substrate is pre-heated to some subreflow temperature for soldering prior to heating just the lead/pad assemblies to the solder reflow temperature. In some cases, the required substrate pre-heating can be performed by conduction heating with a hot plate. Also, vapor phase and infrared techniques could be used. Finally, additional heating of the lead/pad assembly to the reflow temperature can be accomplished with a soldering iron or any single point heat source. A more advantageous system, then, would be presented if such amounts of preheating were reduced or eliminated.

It is apparent from the above that there exists a need in the art for soldering system which is capable of soldering microelectronic lead/pad assemblies to ceramic substrates, and which at least equals the performance characteristics of known soldering systems, but which at the same time substantially eliminates the preheating of the substrate. It is a purpose of this invention to fulfill this and other needs in the art in a manner more apparent to the skilled artisan once given the following disclosure.

SUMMARY OF THE INVENTION

Generally speaking, this invention fulfills these needs by providing a method for soldering electronic lead-/pad assemblies to ceramic substrates including a ceramic substrate, a lead means, a solder means, a pad means, a holding means, and a Nd:YAG laser source means wherein said method comprises placing said pad means at a predetermined location on said substrate, placing said solder means substantially over said pad means, placing said lead means substantially over said solder means to create a lead/pad assembly, placing said holding means substantially over said lead means to retain said lead means, said solder means and said pad means substantially in place with respect to each other and with respect to said substrate, activating said laser source means to create a laser beam and impinging said laser beam on said lead/pad assembly to reflow said solder means and create a solder joint between said lead and said pad.

In certain preferred embodiments, the ceramic substrate is made of aluminum oxide or aluminum nitride. Also, the pad and lead are constructed of a copper based layered composite and copper, respectively. Finally, the holding means is constructed of any suitable transparent material, such as glass.

The preferred soldering system, according to this invention offers the following advantages: excellent solder joints; reduced preheating of the substrate; excellent reliability; increased flexibility; good economy; and high strength for safety. In fact, in many of the preferred embodiments, these factors of excellent solder joints, reduced preheating, reliability and flexibility of the process are optimized to an extent that is considerably higher than heretofore achieved in prior, known soldering systems.

BRIEF DESCRIPTION OF THE DRAWINGS

The above and other features of the present invention which will be more apparent as the description proceeds are best understood by considering the following detailed description in conjunction with the accompanying drawings wherein like character represent like parts throughout the several veins and in which.

DETAILED DESCRIPTION OF THE INVENTION

Figure 1:
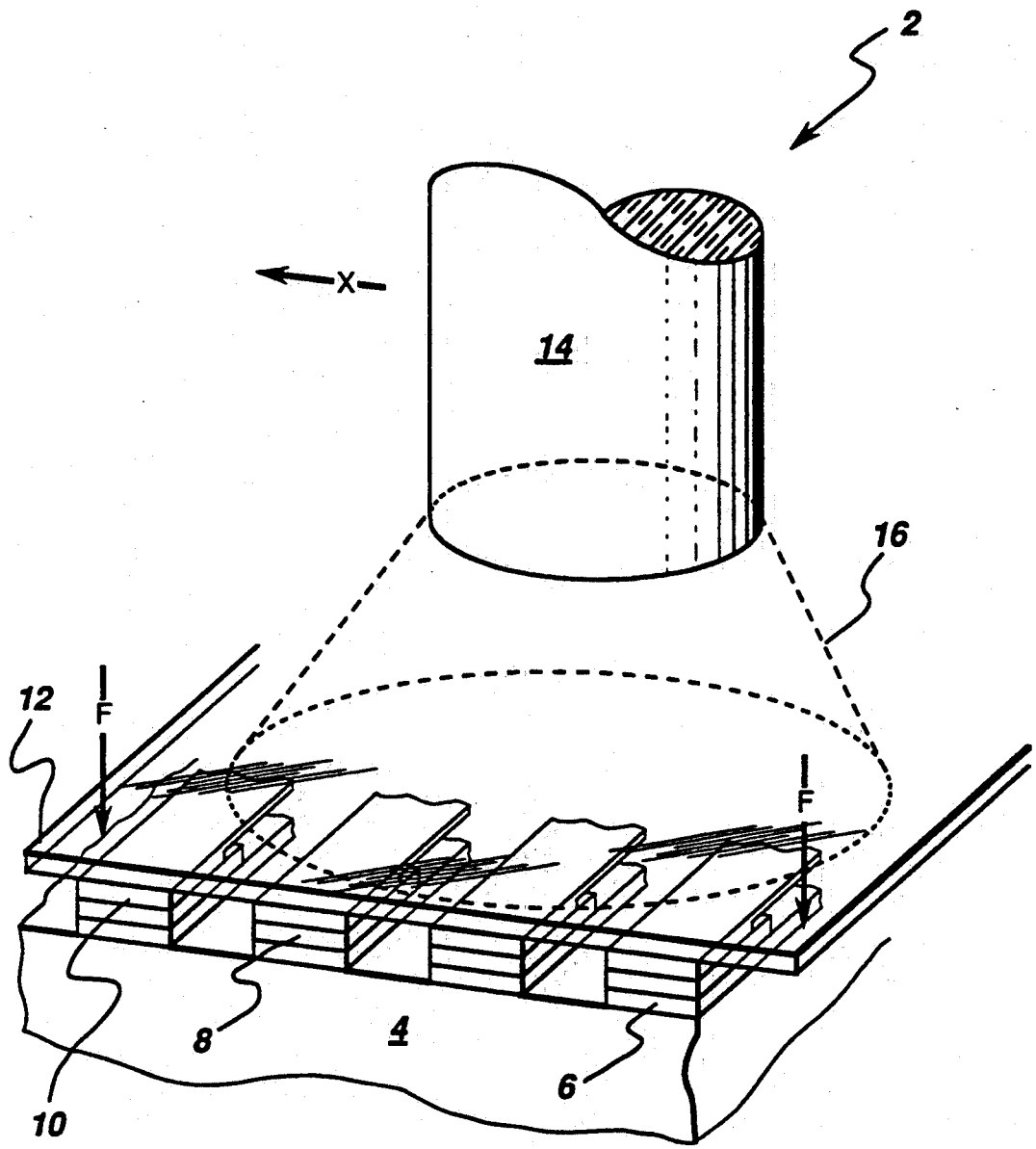
FIG. 1 is a schematic illustration of a laser soldering system for soldering microelectronic lead/pad assemblies to ceramic substrates, according to the present invention.

With reference first to FIG. 1, there is shown a schematic illustration of a laser soldering system 2 for soldering microelectronic lead/pad assemblies on ceramic substrates. System 2 includes, in part, substrate 4, pad 6, solder 8, lead 10, hold down plate 12, and conventional fiber optic 14 which delivers laser beam 16. Substrate 4, preferably, is constructed of aluminum oxide or aluminum nitride. Pad 6, preferably, is constructed of several materials including copper. Solder 8 is any conventional solder alloy plate, however, it can also consist of a conventional tin-lead solder alloy cream with 2% silver. Lead 10, preferably, is a bumped copper lead. However, it is to be understood that any suitable lead, such as a lead from a conventional tape automated bonding (TAB) interconnect may be used as the lead. Hold down plate 12, preferably, is constructed of any suitable transparent material such as glass. With respect to fiber optic 14 and laser beam 16, any suitable fiber-based Nd:YAG laser may be used to provide the required localized heating which will create reflow soldered joint.

During the operation of system 2, pad 6 is attached on substrate 4 at a predetermined position. Solder 8 is then placed up on top of pad 6. Lead 10 is placed upon solder 8 to form a lead/pad assembly between pad 6, solder 8 and lead 10. Finally, hold down plate 12 is placed upon lead 10 in order to securely hold lead 10 and, solder 8 on pad 6. A force (F) is then placed down upon holding plate 12 by any suitable force producing means in order to rigidly hold plate 12 on to lead 10. A conventional laser source (not shown) which is connected to fiber optic 14 is then activated to produce laser beam 16. Fiber optic 14 is translated along the direction of arrow X to create reflow solder joints between lead and pad assembly allowing solder 8 to melt and reflow. It is to be understood that fiber optic 14 may remain stationary while substrate 4 along with pad 6, solder 8, lead 10 and hold down plate 12 are translated along the direction of arrow X.

With respect to the particulars of the operation of system 2, the operation constitutes raising the temperature of lead (tinned copper)/solder (60-40 tin-lead or 62-36-2 tin-lead-silver)/copper or gold lead/pad assemblies with a 1.06 micron wavelength energy from the Nd:YAG laser source (not shown) to affect solder reflow to form a joint. One to three solder joint assemblies would be addressed with laser energy at one given time. This would depend on the pitch of leads 10 and the spot size of the laser beam 16 being used. The copper leads 10 are bumped to provide a desirable form factor for lead/pad registration and partial thermal isolation from pad 6 to pad 6 during laser heating. Lead bumping has been proven useful when lead zirconate titanate was the ceramic substrate 4 (approximately 150 microns thick). The joints were fluxed with a mildly activated flux (a RMA type) prior to positioning and using the transparent hold down plate 12. Laser energy was deposited over a time range of 100-500 milliseconds with the laser power delivered to the work piece via fiber 14 ranging between 20-30 watts depending on the material of substrate 4. Deposition of energy was controlled by either laser beam scanning rate or by shuttering the beam on/off. This approach (point/localized heating, rapid heat deposition and good laser wavelength/material coupling) leads to a more direct heating of the individual lead/pad assemblies and reduced overheating of the ceramic substrate 4.

Figure 2:
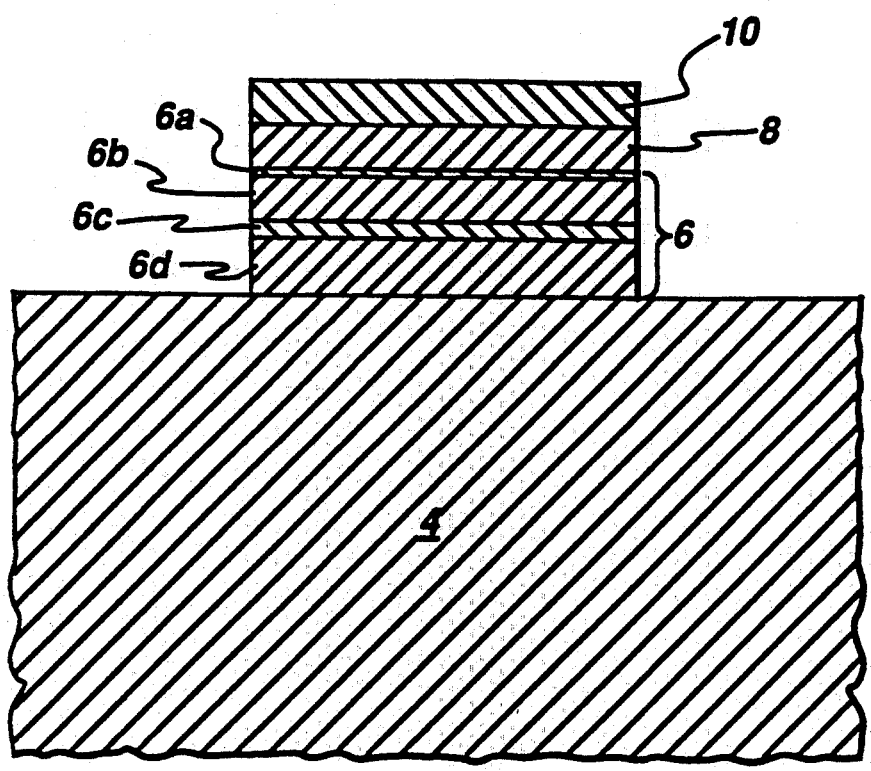
FIG. 2 is a cut away view showing the lead, the solder plate, and the pad soldered to the ceramic substrate, according to the present invention.

With respect to FIG. 2, there is illustrated a complete soldered assembly where a microlead/pad assembly is soldered. In particular, as can be seen in the drawing, lead 10, solder 8 and pad 6 are soldered to substrate 4. It is to be understood that pad 6 is pre-attached to substrate 4. Also, in this particular figure, pad 6 consists of a laminated composite of electrolist tin 6a-copper 6b-titanium 6c-aluminum 6d.

Once given the above disclosure, many other features, modification or improvements will become apparent to the skilled artisan. Such features, modifications or improvements are, therefore, considered to be a part of this invention, the scope of which is to be determined by the following claims.

What is claimed is:

1. A method for soldering electronic lead/pad assemblies on ceramic substrates including a ceramic substrate, a lead means, a solder means, a pad means including a laminated composite of aluminum, titanium, copper and tin, a holding means, and a Nd:YAG laser source means wherein said method is comprised of the steps of:

placing said pad means at a predetermined location on said substrate;
   placing said solder means substantially over said pad means;
   placing said lead means substantially over said solder means to create a lead/pad assembly;
   placing said holding means substantially over said lead means to retain said lead means, said holder means and said pad means substantially in place with respect to each other and with respect to said substrate;
   activating said laser source means to create a laser beam; and
   impinging said laser beam on said lead/pad assembly through said holding means to reflow said solder means and create a solder joint between said lead and said pad.

2. The method, as in claim 1, wherein said substrate is further comprised of:
   aluminum oxide.

3. The method, as in claim 1, wherein said substrate is further comprised of:
   aluminum nitride.

4. The method, as in claim 1, wherein said lead means is further comprised of:
   copper.

5. The method, as in claim 1, wherein said lead means is further comprised of:
   a bumped copper lead.

6. The method, as in claim 1, wherein said solder means is further comprised of:
   a solder plate.

7. The method, as in claim 1, wherein said solder means is further comprised of:
   a solder cream.

8. The method, as in claim 1, wherein said pad means is further comprised of:
   copper.

9. The method, as in claim 1, wherein said holding means is further comprised of:
   a transparent material.

10. The method, as in claim 1, wherein said holding means is further comprised of:
    glass.

11. The method, as in claim 1, wherein said method is further comprised of the step of:
    translating said laser source means and said laser beam past said lead/pad assembly and said substrate.

12. The method, as in claim 1, wherein said method is further comprised of the step of:
    translating said laser/pad assembly and said substrate past said laser beam.

13. An apparatus for laser soldering an electronic lead/pad assembly on a ceramic substrate, wherein said apparatus is comprised of:
    a ceramic substrate;
    a copper pad means located at a predetermined location on said substrate;
    a solder means located adjacent to said pad means;
    a bumped copper lead means located adjacent to said solder means such that said pad means, said solder means and said lead means form a lead/pad assembly;
    a transparent holding means for retaining said lead on said pad; and
    a laser source means which produces a laser beam that substantially passes through said holding means and impinges said lead/pad assembly to reflow said solder means to create a solder joint between lead/pad assembly.

* * * * *